United States Patent [19]

Nakamura et al.

[11] Patent Number: 4,467,202
[45] Date of Patent: Aug. 21, 1984

[54] PHOTOELECTRIC DETECTOR

[75] Inventors: Kenichi Nakamura; Hiroshi Obara, both of Fukushima, Japan

[73] Assignee: Kureha Kagaku Kogyo Kabushiki Kaisha, Tokyo, Japan

[21] Appl. No.: 353,397

[22] Filed: Mar. 1, 1982

[30] Foreign Application Priority Data

Mar. 4, 1981 [JP] Japan .............................. 56-30165[U]
Mar. 4, 1981 [JP] Japan .............................. 56-30166[U]

[51] Int. Cl.$^3$ .............................................. G01J 1/00
[52] U.S. Cl. ..................................... 250/338; 250/342
[58] Field of Search ...................... 250/338, 340, 342; 374/177, 178, 188, 208

[56] References Cited

U.S. PATENT DOCUMENTS

| | | | |
|---|---|---|---|
| 3,539,803 | 11/1970 | Beerman ............................. | 250/338 |
| 3,903,733 | 9/1975 | Murayama et al. ................... | 73/71.4 |
| 4,044,251 | 8/1977 | Taylor et al. ....................... | 250/338 |
| 4,218,620 | 8/1980 | Oettel .................................. | 250/338 |
| 4,258,260 | 3/1981 | Obara et al. ........................ | 250/338 |

Primary Examiner—Janice A. Howell
Attorney, Agent, or Firm—Woodcock, Washburn, Kurtz, Mackiewicz & Norris

[57] ABSTRACT

The photoelectric detector contains a photosensor or light-sensing element of a pyroelectric polymer film interposed by two disturbance-preventive chambers such that the two disturbance-preventive chambers are designed so as to equalize the pressures therein to ambient pressure.

The photoelectric detector undergoes no or little disturbance from the ambient atmosphere, thereby permitting an accurate detection or measurement of light or beams detected by the photosensor or light-sensing element mounted in the detector.

37 Claims, 3 Drawing Figures

PHOTOELECTRIC DETECTOR

BACKGROUND OF THE INVENTION

1. Field of the Invention

The present invention relates to a photoelectric detector and, more particularly, to a photoelectric detector using a pyroelectric polymer film as a photosensor or light-sensing element.

2. Brief Description of the Prior Art

It is known that a piezoelectric polymer material such as polyvinylidene vinylidene or the like has also a pyroelectric property. This pyroelectric property can be utilized for an opto electro transducer of which a photoelectric detector is composed. Such an opto electro transducer can be used as a sensing element for a detector such as a fire alarm or an intrusion alarm, an optical calorimeter for measuring the output of a laser beam or otherwise. In particular, the pyroelectric polymer film can provide an element of a large area having a uniform distribution in pyroelectricity so that it is useful for an optical calorimeter having a high output with less dependence upon beam diameters. An opto electro transducer resulting from such a polymer material having a polarity, such as polyvinylidene fluoride or the like can be obtained by polarizing the material at a voltage and a direct current. The opto electro transducer is mounted on a frame to make a photoelectric detector. The photoelectric detector is constructed such that light transmitted into the opto electro transducer is converted to electric outputs thereby with the strength of the light, thereby measuring or detecting the light.

As the opto electro transducer also has a piezoelectric property, there is a disadvantage that a pressure being applied from the ambient environment or a disturbance from the outside, such as a sound or wind may cause vibration of the opto electro transducer and consequently the output voltage is caused to occur in association with or in accordance with the vibration of the transducer. Accordingly, such a disturbance may result in a misoperation or an error in measurement. In order to prevent the disturbance from being caused, it is proposed to place an opto electro transducer in a space which is controlled so as not to undergo an influence from a disturbance. This requires a provision of two disturbance-preventive chambers with a transducer mounted therebetween. This also causes a temperature differential between the two chambers with the energy of incoming light absorbed by the transducer giving rise to a cause of noises. In this system, the disturbance-preventive chambers are closed air-tightly, so that a pressure differential is caused to occur between the two chambers. This pressure differential also results in noises.

OBJECTS AND SUMMARY OF THE INVENTION

An object of the present invention is to provide a photoelectric detector which hardly or does not undergo an adverse influence from a disturbance.

An object of the present invention is to provide a photoelectric detector in which no or less pressure differential is caused between two disturbance-preventive chambers provided so as to interpose a photosensor or light-sensitive element.

A further object of the present invention is to provide a photoelectric detector in which the photosensor or light-sensing element is prevented from deformation due to a pressure differential between the two disturbance-preventive chambers.

In accordance with the principles of the present invention, a photoelectric detector is provided with a photosensor or light-sensing element of a film of a pyroelectric polymer disposed between two disturbance-preventive chambers, said chambers being constructed such that the pressures in the disturbance-preventive chambers become equal to ambient pressure.

DESCRIPTION OF THE PREFERRED EMBODIMENT

The photoelectric detector in accordance with the present invention is constructed such that a light-sensing or photosensor element is provided between two disturbance-preventive chambers so as to sense light or light beams transmitted through one of the disturbance-preventive chambers. The first and second chambers are designed so as to provide a pressure equal to ambient pressure, thereby avoiding a pressure differential between the chambers and consequently preventing a disturbance from external pressures such as sounds or wind from being caused to occur. The removal of the pressure differential can also prevent deformation of the light-sensing element resulting from a pressure differential, thereby avoiding the generation of noises.

In accordance with the present invention, the light-sensing element is made from a film produced by the polarization of a pyroelectric polymer. The pyroelectric polymer may include, for example, a homopolymer of a monomer having a large polarity, such as vinyl fluoride, vinylidene fluoride, trifluoroethylene, fluorochlorovinylidene or the like or a copolymer of such monomers or a composition composed mainly of such homopolymer or copolymer. Among them, it is particularly preferred to use a copolymer containing vinylidene fluoride in an amount larger than 50 mol% because such a copolymer has an extremely high pyroelectricity. It is also possible to use a composition comprising a vinylidene fluoride polymer or a copolymer of the vinylidene fluoride monomer as a major component and an inorganic ferroelectric substance such as PZT (solid solution of $PbZrO_3$ and $PbTiO_3$) or the like because such a composition has also a high pyroelectricity.

Figure 1:
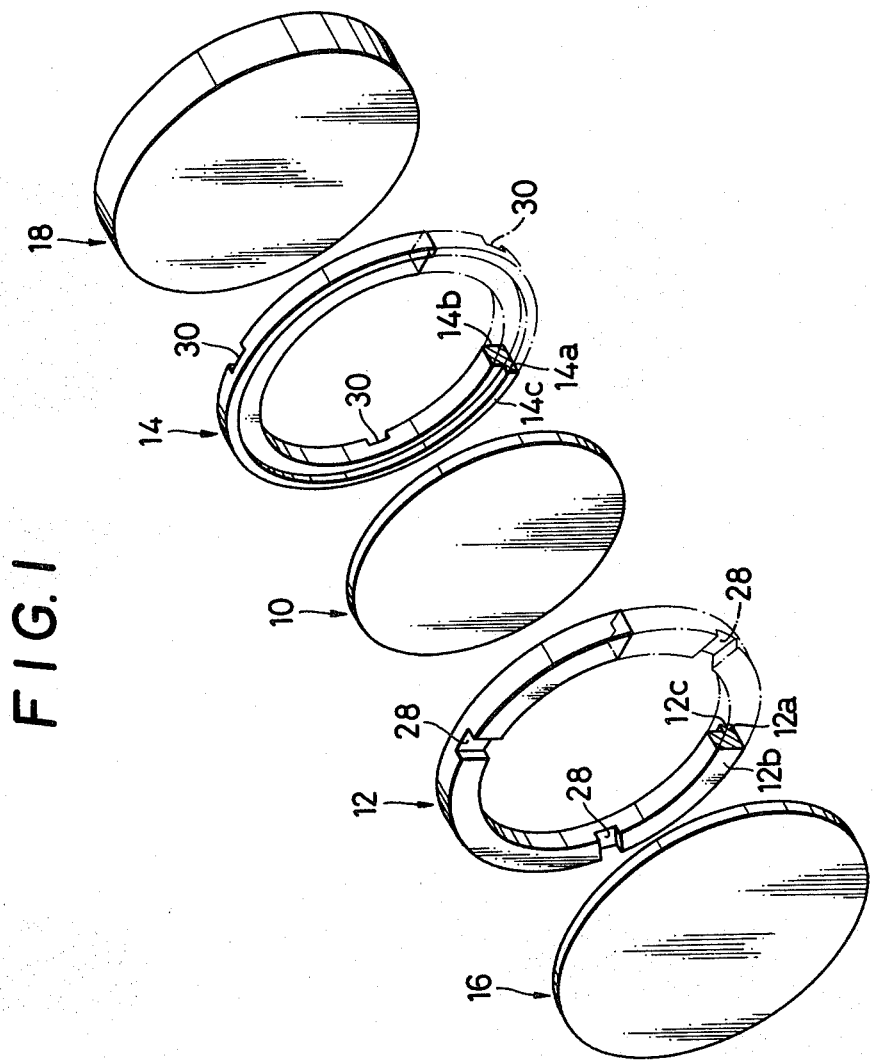
FIGS. 1 and 2 are each an exploded perspective view illustrating a photoelectric detector in accordance with the present invention.
Figure 2:
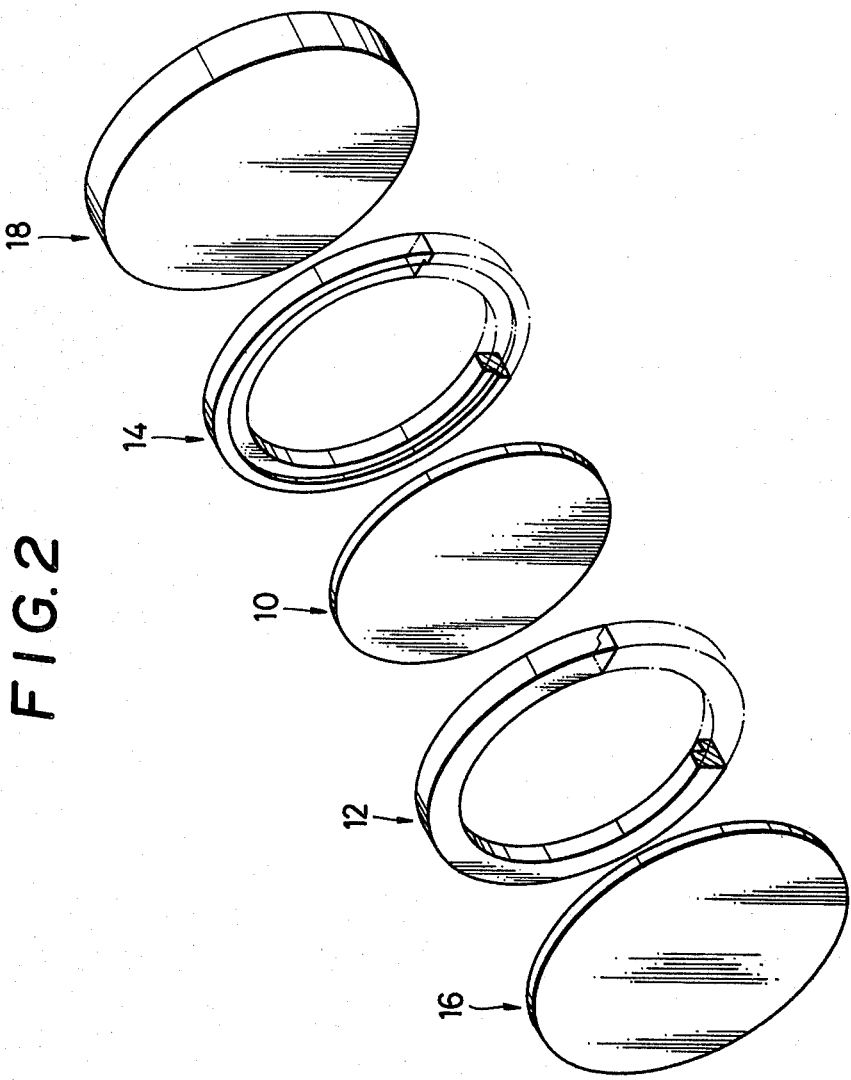

Referring to FIGS. 1 and 2, a photoelectric detector is seen to comprise a light-sensing or photosensor element 10 constituting an opto electro transducer, a first O-shaped ring 12 for holding the peripheral front portion of the light-sensing element, a second O-shaped ring 14 for holding the peripheral rear portion of the light-sensing element, a protective plate 16 for protecting the front side of the light-sensing element, and a backing member 18 fitted to the second O-shaped ring. Between the protective plate 16 and the front surface of the light-sensing element 10 is formed a first disturbance-preventive chamber 20. Between the backing plate 18 and the rear surface of the light-sensing element 10 is formed a second disturbance-preventive chamber 22.

Figure 3:
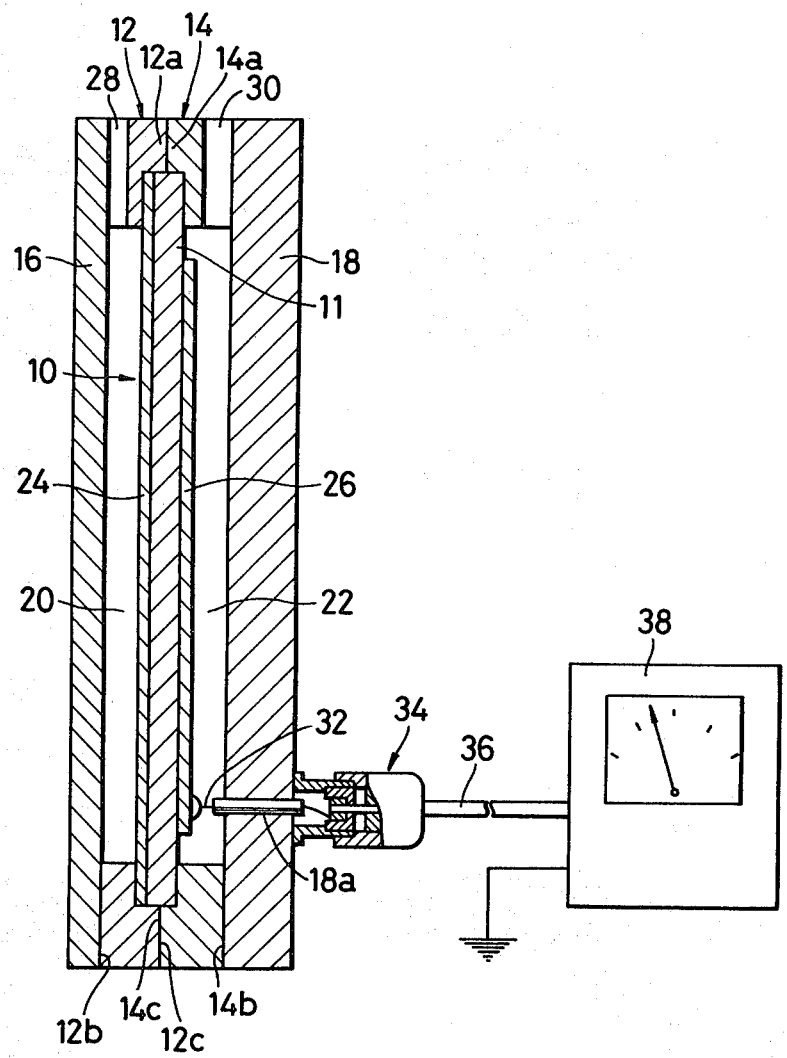
FIG. 3 is a cross sectional view illustrating the photoelectric detector of FIG. 1.

As shown in FIG. 3, the pyroelectric polymer film 11 for the photosensor or light-sensing element 10 to be used as a photoelectro transducer is provided at its both sides with first and second electrodes 24 and 26, respectively. The first electrode 24 formed at the front side of the polymer film is an infrared absorbing electrode or a transparent electrode. The infrared absorbing electrode comprises a metal conductive electrode coated with a coating having a good light absorbability, such as gold black or carbon-filled paint. The transparent electrode may include, for example, a transparent conductive material such as tin oxide, indium oxide or the like or a film of a metal such as gold or nickel which is rendered thinner so as to permeate light. The second electrode 26 formed at the rear side of the polymer film may be composed of a film of a metal such as aluminum or nickel.

Referring again to FIG. 3, the first electrode 24 is provided over a substantially whole area of the pyroelectric polymer film 11 so as to electrically connect the first electrode to the conductive first O-shaped ring 12 when fitted to the ring. The electrode 26 formed at the rear side of the polymer film 11 may be formed at the middle portion of the rear surface of the polymer film so as to form a predetermined spacing from the second O-shaped ring 14, thus permitting an electrical disconnection from the ring.

Turning back to FIGS. 1 and 2, the first and second O-shaped rings 12 and 14, respectively, are usually made from a conductive metal and may have any size, for example 100 mm in diameter, so as to fit the peripheral portion of the photosensor element 10. The O-shaped rings may have each an L-shaped cross section. The O-shaped rings 12 and 14 with the L-shaped cross sections are each designed such that the outer circumferential portion thereof has a projection 12a or 14a, respectively, so as to have the inner side of the projection fit the outer peripheral portion of the photosensor element 10. The O-shaped rings may be tapered at the sides thereof so as to fit the peripheral portions of the photosensor element.

As shown in FIG. 1, the first O-shaped ring 12 may be provided with three rectangular grooves 28 at the flat front side 12b which is brought in contact with the protective plate 16. The three grooves are formed at an angle of 120° with respect to each other in the radial direction of the ring. The grooves 28 form openings which communicate the first disturbance-preventive chamber 20 to the outside when the protective plate 16 is fitted to the first O-shaped ring 12. Likewise, the second O-shaped ring 14 may be provided with three rectangular grooves 30 at an angle of 120° with respect to each other on the rear side 14b in the radial direction of the ring. The grooves 30 also form openings which communicate the second disturbance-preventive chamber 22 to the outside. The number of the grooves to be formed on the O-shaped ring 12 or 14 is not restricted to a particular one.

In embodiments where the O-shaped ring is made from a material having open or interconnecting cells, such as a sintered metal, such cells serve as grooves to be otherwise formed on the O-shaped ring so that a provision of the grooves is not required, as shown in FIG. 2. It is also to be noted as a matter of course that grooves to be formed thereon are not restricted to those which are formed on the circumferential side of the O-shaped ring and they may be openings to be formed through the body of the O-shaped ring in the radial direction thereof.

As shown in FIG. 3, in instances where the first O-shaped ring 12 is mounted so as to fit and hold the peripheral portion of the photosensor element 10 in association with the second O-shaped ring 14, the flat surface 12c of the projection 12a of the first O-shaped ring 12 is also abutted with the flat surface 14c of the projection 14a of the second O-shaped ring 14. In this case, the first electrode 24 formed over a substantially whole area of the front surface of the polymer film 11 is also fitted to the first O-shaped ring 12. This fitting accordingly connects electrically the first O-shaped ring 12 to the second O-shaped ring 14.

The protective plate 16 serves as protecting the photosensor or light-sensing element 10 from external objections and can prevent it from causing an output of voltage to be produced by means of a piezoelectric action of the polymer film 11 from a disturbance such as vibration of air and noises resulting from sounds or wind. The protective plate is made of a material which can permeate light or laser beams. Such a material may include, for example, a synthetic material or a natural material such as polyethylene, polyvinylidene fluoride, silicon, germanium and sapphire. The protective plate may be connected with an adhesive to the flat side 12b of the first O-shaped ring 12, said side being provided with the three rectangular grooves 28 which in turn form through-openings communicating the first disturbance-preventive chamber 20 to the outside, as shown in FIG. 3. The connection of the protective plate to the first O-shaped ring may vary in any manner, for example, such that an additional ring (not shown) is provided so as to tightly high the protective plate with the first O-shaped ring.

The backing member 18 may be made from a conductive metal in instances where a shield case is constituted by the rear surface of the photosensor element 10, the second O-shaped ring 14 and the surface of the backing member 18. The backing member may also be made from a non-conductive material by forming a conductive material on the front surface of the non-conductive backing member opposing to the rear surface of the photosensor element. The backing member is connected to the flat side of the second O-shaped ring 14, said side being provided with the three rectangular grooves 30 as shown in FIG. 1. The connection of the backing member to the second O-shaped ring may be effected in various ways, for example, with a screw or an adhesive. The backing member is electrically connected to the first electrode 24 through the first and second O-shaped rings 12 and 14, respectively.

As shown in FIG. 3, the backing member 18 is seen to have an opening 18a through which a lead 32 connects the second electrode 26 through a connector 34 and a shield wire 36 to a voltage meter 38. A terminal at the minus side of the connector is electrically connected to the backing member so that the terminal constitutes an ground line.

It is also to be noted that the backing member 18 may be formed integrally with the second O-shaped ring 14. It is further noted that, in place of or in combination with the rectangular grooves formed on the outer flat surface of the O-shaped ring, an opening or plural openings may be formed on the O-shaped ring in its radial direction or directions or on the protective plate and/or the backing member. It is also possible to provide an effect of preventing a disturbance by bending a shield hole or holes although this feature renders a somewhat complicated structure.

Referring to FIG. 3, the first disturbance-preventive chamber 20 is seen to communicate to the outside through the three openings formed between the protective plate 16 and the three rectangular grooves 28 formed on the first O-shaped ring 12, whereby the pressure in the chamber is maintained at ambient pressure. Likewise, the second disturbance-preventive chamber 22 is communicated to the outside through the three openings formed between the backing member 18 and the three rectangular grooves 30 present on the second O-shaped ring 14. The openings 30 enable the equalization of the pressure in the second disturbance-preventive chamber to ambient pressure.

The photoelectric detector of the type described hereinabove and illustrated in the accompanying drawings may be applicable to an optical calorimeter for measuring the strength of laser beams.

In embodiments in accordance with the present invention, incoming laser beams which passed through the protective plate 16 activate the pyroelectric property inherent in the polymer film, causing to raise a voltage between a pair of the first and second electrodes 24 and 26, respectively, in accordance with the strength of the laser beams. The output voltage is taken by the second electrode 26 maintained at the ground voltage and then fed to the voltage meter 38 through the lead 32, the connector 34 and the shield wire 36. The measurement of the output voltage is then made by the voltage meter.

In accordance with the present invention, the first disturbance-preventive chamber 20 formed at the front side of the photosensor element 10 can prevent vibration caused by an external disturbance such as acoustics or wind from being transmitted to the photosensor element. Thus, the photosensor element can avoid the generation of an output voltage by means of the piezoelectric property of the polymer film which may otherwise be caused to occur by vibration from the acoustics or wind. Accordingly, the photoelectric detector of the type as described hereinabove enables a measurement of the strength of laser beams with high precision without being subject to disturbance noises resulting from the acoustics or wind.

In embodiments in accordance with the present invention the first and second disturbance-preventive chambers 20 and 22, respectively, are designed so as to have pressures equal to ambient pressure. This construction can avoid the formation of a pressure differential between the first and second chambers even if the temperature within the first chamber is raised by light radiated to the protective plate, thereby preventing an output voltage from being produced by means of the piezoelectric action which may be caused to occur by deformation of the photosensor element due to the pressure differential between the first and second chambers. Accordingly, the photoelectric detector of this type permits an accurate measurement of the strength of laser beams.

As have been described hereinabove, the first electrode 24 formed at the front side of the polymer film is electrically connected through the pair of the rings 12 and 14 to the backing member 18 and the second disturbance-preventive chamber 22 is constructed so as to form a shield case with the first electrode 24, the pair of the O-shaped rings 12 and 14, and the backing member 18. The shield case can serve as interrupting electric noises produced by, for example, an exterior commercial AC source, a laser oscillator, an amplifier or the like from acting on the second electrode 26. Accordingly, this structure also permits an accurate and reliable measurement without an adverse influence from electrical noises. This construction also allows a compact meter having a shield function without any additional housing. It is noted herein that, as the openings to be formed for communication of the second disturbance-preventive chamber to the outside are relatively small, little decrease in the shield effect is recognized.

It is also to be noted herein that the photoelectric detector of the type described hereinabove and illustrated in the accompanying drawings is applicable to an optical detector such as a fire alarm or an intrusion alarm and any other optical detector.

What is claimed is:

1. A photoelectric detector comprising:
   a light-sensing element of a film of a pyroelectric polymer;
   a first disturbance-preventive chamber and a second disturbance-preventive chamber, said first and second disturbance-preventive chambers being constructed so as to have a pressure equal to ambient pressure;
   said light-sensing element being interposed between said first and second disturbance-preventive chambers, said light-sensing element comprising said pyroelectric polymer film and a first electrode and a second electrode disposed at both major surfaces thereof, and being fitted by a pair of rings comprising a first O-shaped ring and a second O-shaped ring;
   said first O-shaped ring being connected to a protective plate and said second O-shaped ring being connected to a backing member;
   said first disturbance-preventive chamber comprising an enclosure formed by said light-sensing element, said first O-shaped ring and said protective plate; and
   said second disturbance-preventive chamber comprising an enclosure formed by said backing member, said second O-shaped ring and said light-sensing element.

2. The photoelectric detector of claim 1 in which said second O-shaped ring is formed integrally with said backing member.

3. The photoelectric detector according to claim 1 wherein said first electrode is made from a transparent electrode.

4. The photoelectric detector according to claim 3 wherein said transparent electrode consists essentially of an oxide selected from the group consisting of tin oxide and indium oxide.

5. The photoelectric detector according to claim 1 wherein said second electrode is made from a metal.

6. The photoelectric detector according to claim 5 wherein said metal consists essentially of a metal selected from the group consisting of aluminum and nickel.

7. The photoelectric detector according to claim 1 wherein said first electrode is an infrared absorbing electrode comprising a metal conductive electrode coated with a coating having a light absorbability.

8. The photoelectric detector according to claim 7 wherein said coating consists essentially of a coating selected from the group consisting of gold black and carbon-filled paint.

9. The photoelectric detector according to claim 1, 2, 3, 4, 5, 6, 7 or 8 wherein said first electrode is provided on the front surface of the polymer film so as to permit an electrical connection to the first O-shaped ring.

10. The photoelectric detector according to claim 1, 2, 3, 4, 5, 6, 7 or 8 wherein said second electrode is provided on the rear surface of the polymer film so as to form a spacing for permitting an electrical disconnection to the second O-shaped ring.

11. The photoelectric detector according to claim 1 wherein said first and second disturbance-preventive chambers are communicated each to the outside through at least one opening.

12. The photoelectric detector according to claim 11 wherein said opening is formed on at least one of said O-shaped rings.

13. The photoelectric detector according to claim 12 wherein said opening is formed by means of at least one groove formed on the side of at least one of said O-shaped rings with the aid of an additional surface.

14. The photoelectric detector according to claim 13 wherein said opening is provided on said additional surface.

15. The photoelectric detector according to claim 11 wherein said opening comprises an interconnecting cell formed in at least one of the first O-shaped rings.

16. The photoelectric detector according to claim 1 wherein said first and second O-shaped rings are each made from a conductive metal.

17. The photoelectric detector according to claim 16 wherein at least one of said O-shaped rings is provided with at least one opening.

18. The photoelectric detector according to claim 17 wherein said opening is a groove.

19. The photoelectric detector according to claim 1 or 2 wherein said first and second O-shaped rings are each tapered at its side so as to fit the light-sensing element.

20. The photoelectric detector according to claim 1 or 2 wherein said protective plate comprises a material transparent enough to permit light to permeate through the material.

21. The photoelectric detector according to claim 1 or 2 wherein said backing member is formed integrally with the second O-shaped ring.

22. The photoelectric detector according to claim 1 or 2 wherein said backing member comprises at least one layer of a conductive material at which said backing member is brought into contact with the second O-shaped ring.

23. The photoelectric detector according to claim 1 or 2 wherein said backing member is electrically connected to said first electrode formed on the front surface of the polymer film so as to constitute a shield case.

24. The photoelectric detector according to claim 2 wherein said first electrode is made from a transparent electrode.

25. The photoelectric detector according to claim 24 wherein said transparent electrode consists essentially of an oxide selected from the group consisting of tin oxide and indium oxide.

26. The photoelectric detector according to claim 2 wherein said first electrode is an infrared absorbing electrode comprising a metal conductive electrode coated with a coating having a light absorbability.

27. The photoelectric detector according to claim 26 wherein said coating consists essentially of a coating selected from the group consisting of gold black and carbon-filled paint.

28. The photoelectric detector according to claim 2 wherein said second electrode is made from a metal.

29. The photoelectric detector according to claim 28 wherein said metal consists essentially of a metal selected from the group consisting of aluminum and nickel.

30. The photoelectric detector according to claim 2 wherein said first and second disturbance-preventive chambers are communicated each to the outside through at least one opening.

31. The photoelectric detector according to claim 30 wherein said opening is formed on at least one of said O-shaped rings.

32. The photoelectric detector according to claim 31 wherein said opening is formed by means of at least one groove formed on the side of at least one of said O-shaped rings with the aid of an additional surface.

33. The photoelectric detector according to claim 32 wherein said opening is provided on said additional surface.

34. The photoelectric detector according to claim 30 wherein said opening comprises an interconnecting cell formed in at least one of the O-shaped rings.

35. The photoelectric detector according to claim 2 wherein said first and second O-shaped rings are each made from a conductive metal.

36. The photoelectric detector according to claim 35 wherein at least one of said O-shaped rings is provided with at least one opening.

37. The photoelectric detector according to claim 36 wherein said opening is a groove.

* * * * *